US009559161B2

(12) United States Patent
Curatola

(10) Patent No.: US 9,559,161 B2
(45) Date of Patent: Jan. 31, 2017

(54) PATTERNED BACK-BARRIER FOR III-NITRIDE SEMICONDUCTOR DEVICES

(71) Applicant: Infineon Technologies Austria AG, Villach (AT)

(72) Inventor: Gilberto Curatola, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/540,463

(22) Filed: Nov. 13, 2014

(65) Prior Publication Data

US 2016/0141354 A1    May 19, 2016

(51) Int. Cl.
| | | |
|---|---|---|
| *H01L 29/06* | (2006.01) | |
| *H01L 29/778* | (2006.01) | |
| *H01L 29/66* | (2006.01) | |
| *H01L 29/10* | (2006.01) | |
| H01L 29/40 | (2006.01) | |

(Continued)

(52) U.S. Cl.
CPC ....... *H01L 29/0607* (2013.01); *H01L 29/1054* (2013.01); *H01L 29/66462* (2013.01); *H01L 29/7783* (2013.01); *H01L 29/7786* (2013.01); H01L 29/2003 (2013.01); H01L 29/205 (2013.01); H01L 29/402 (2013.01)

(58) Field of Classification Search
None
See application file for complete search history.

(56) References Cited

U.S. PATENT DOCUMENTS 7,863,648 B2 *   1/2011   Miyamoto ............ H01L 29/402
                                                257/189
7,928,475 B2 *   4/2011   Parikh .................. H01L 29/812
                                                257/194

(Continued)

OTHER PUBLICATIONS

Ambacher, et al., "Two-dimensional Electron Gases Introduced by Spontaneous and Piezoelectric Polarization Charges in N- and Ga-face AlGaN/Gan Heterostructures", Journal of Applied Physics, vol. 85, No. 6, Mar. 15, 1999, American Institute of Physics, pp. 3222-3233.

(Continued)

*Primary Examiner* — Ali Naraghi
(74) *Attorney, Agent, or Firm* — Murphy, Bilak & Homiller, PLLC

(57) ABSTRACT

A compound semiconductor device includes a III-nitride buffer and a III-nitride barrier on the III-nitride buffer. The III-nitride barrier has a different band gap than the III-nitride buffer so that a two-dimensional charge carrier gas channel arises along an interface between the III-nitride buffer and the III-nitride barrier. The compound semiconductor device further includes a source and a drain spaced apart from one another and electrically connected to the two-dimensional charge carrier gas channel, a gate for controlling the two-dimensional charge carrier gas channel between the source and the drain, and a patterned III-nitride back-barrier buried in the III-nitride buffer. The patterned III-nitride back-barrier extends laterally beyond the gate towards the drain and terminates prior to the drain so that the patterned III-nitride back-barrier is laterally spaced apart from the drain by a region of the III-nitride buffer.

18 Claims, 8 Drawing Sheets

(51) Int. Cl.
*H01L 29/20* (2006.01)
*H01L 29/205* (2006.01)

(56) References Cited

U.S. PATENT DOCUMENTS

| | | | |
|---|---|---|---|
| 8,530,936 B2 * | 9/2013 | Ishii | H01L 29/404 257/192 |
| 8,759,879 B1 | 6/2014 | Tipirneni et al. | |
| 9,093,512 B2 * | 7/2015 | Ohki | H01L 29/402 |
| 2005/0189559 A1 * | 9/2005 | Saito | H01L 29/1066 257/189 |
| 2010/0258912 A1 * | 10/2010 | Beach | H01L 21/0237 257/615 |
| 2010/0314666 A1 * | 12/2010 | Saito | H01L 29/0619 257/201 |
| 2011/0303952 A1 | 12/2011 | Hwang et al. | |
| 2013/0153967 A1 * | 6/2013 | Curatola | H01L 29/407 257/194 |
| 2013/0200389 A1 * | 8/2013 | Lee | H01L 29/205 257/76 |
| 2014/0042448 A1 | 2/2014 | Ostermaier et al. | |
| 2014/0312362 A1 * | 10/2014 | Makiyama | H01L 29/7787 257/77 |
| 2015/0140745 A1 * | 5/2015 | Hsu | H01L 29/267 438/172 |
| 2015/0194513 A1 | 7/2015 | Curatola | |
| 2015/0318360 A1 | 11/2015 | Lu et al. | |

OTHER PUBLICATIONS

Bahat-Treidel, et al., "Punchthrough-Voltage Enhancement of AlGaN/GaN HEMTs Using AlGaN Double-Heterojunction Confinement", IEEE Transactions on Electron Devices, vol. 55, No. 12, Dec. 2008, pp. 3354-3359.

Kocan, Martin, "AlGaN/GaN MBE 2DEG Heterostructures: Interplay between Surface-, Interface and Device-Properties", Institut für Schichten und Grenzflächen, Dissertation, Jul. 16, 2003, pp. 1-219.

* cited by examiner

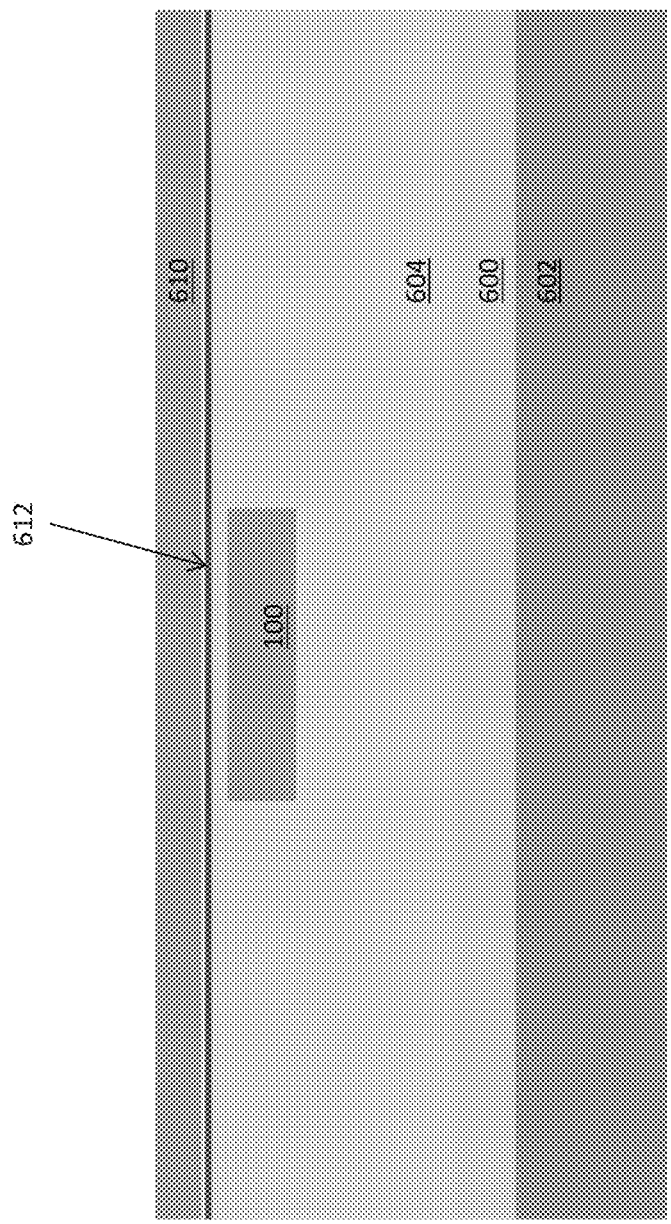

# PATTERNED BACK-BARRIER FOR III-NITRIDE SEMICONDUCTOR DEVICES

TECHNICAL FIELD

The present application relates to III-nitride semiconductor devices, in particular back-barriers for III-nitride semiconductor devices.

BACKGROUND

GaN-based HEMTs (high electron mobility transistors) with a uniform AlGaN buffer, also commonly referred to as an AlGaN back-barrier, have been proposed as an alternative to the common HEMT on pure GaN buffer with the main aim to reduce punch-through effects and reduce source-to-drain leakage current in off-state conditions. Uniform AlGaN back-barriers also have been used in conjunction with normally-off device concepts, with the additional purpose of increasing the device threshold voltage as an effect of the additional quantum confinement of carriers between the main AlGaN barrier and the AlGaN back-barrier.

The reduction of the maximum electric field in presence of a uniform AlGaN back-barrier is mainly due to hole accumulation in off-state conditions. Accumulated holes effectively act as a back field-plate which shields the high voltage applied at the drain side and dramatically reduces the electric field in the gate region. However, while hole accumulation is very effective in reducing the maximum electric field in the device, this is very detrimental for device performance. Indeed, hole accumulation results in a reduction of the effective buffer thickness which in turn translates into a large increase in the device capacitance and consequently degradation of device performance. Greater device capacitance is detrimental not only because it implies a general increase in the overall device output capacitance, but also because it implies higher risks of unwanted spurious turn-on effects. In the typical case of a GaN HEMT with a uniform back-barrier, the Al content in the back-barrier is only a few percent (e.g. 3-4%). As a consequence, the effect of hole accumulation and breakdown reduction is only marginal. On the other hand, if the uniform back-barrier is to be used for reducing the overall electric field, then the Al content must be increased which results in the issues mentioned above.

SUMMARY

According to an embodiment of a compound semiconductor device, the compound semiconductor device comprises a III-nitride buffer and a III-nitride barrier on the III-nitride buffer. The III-nitride barrier has a different band gap than the III-nitride buffer so that a two-dimensional charge carrier gas channel arises along an interface between the III-nitride buffer and the III-nitride barrier. The compound semiconductor device further comprises a source and a drain spaced apart from one another and electrically connected to the two-dimensional charge carrier gas channel, a gate for controlling the two-dimensional charge carrier gas channel between the source and the drain, and a patterned III-nitride back-barrier buried in the III-nitride buffer. The patterned III-nitride back-barrier extends laterally beyond the gate towards the drain and terminates prior to the drain so that the patterned III-nitride back-barrier is laterally spaced apart from the drain by a region of the III-nitride buffer.

According to another embodiment of a compound semiconductor device, the compound semiconductor device comprises a III-nitride buffer and a III-nitride barrier on the III-nitride buffer. The III-nitride barrier has a different band gap than the III-nitride buffer so that a two-dimensional charge carrier gas channel arises along an interface between the III-nitride buffer and the III-nitride barrier. The compound semiconductor device further comprises a source and a drain spaced apart from one another and electrically connected by the two-dimensional charge carrier gas channel, a gate for controlling the two-dimensional charge carrier gas channel, and a patterned III-nitride back-barrier buried in the III-nitride buffer. The patterned III-nitride back-barrier has a top side facing the III-nitride barrier, a bottom side opposite the top side, a first lateral edge extending between the top and the bottom side and facing towards the drain, and a second lateral edge extending between the top and the bottom side and facing towards the source. At least the top side, the first lateral edge and the second lateral edge of the patterned III-nitride back-barrier are covered by the III-nitride buffer. The patterned III-nitride back-barrier extends laterally beyond the gate towards the drain.

According to an embodiment of a method of manufacturing a compound semiconductor device, the method comprises: forming a III-nitride buffer on a substrate; forming a patterned III-nitride back-barrier buried in the III-nitride buffer; forming a III-nitride barrier on the III-nitride buffer, the III-nitride barrier having a different band gap than the III-nitride buffer so that a two-dimensional charge carrier gas channel arises along an interface between the III-nitride buffer and the III-nitride barrier; forming a source and a drain spaced apart from one another and electrically connected to the two-dimensional charge carrier gas channel; and forming a gate for controlling the two-dimensional charge carrier gas channel between the source and the drain. The patterned III-nitride back-barrier extends laterally beyond the gate towards the drain and terminates prior to the drain so that the patterned III-nitride back-barrier is laterally spaced apart from the drain by a region of the III-nitride buffer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2E illustrate a method of manufacturing the compound semiconductor device shown in FIG. 1.

DETAILED DESCRIPTION

The embodiments described herein provide for a compound semiconductor device having a patterned III-nitride back-barrier buried in the III-nitride buffer of the device. The thickness, length, lateral extension, Al content and vertical spacing of the patterned III-nitride back-barrier with respect to the channel each can be chosen so that the patterned III-nitride back-barrier enhances the reliability of the device by reducing electric field buildup within the III-nitride barrier of the device, without reducing device performance. For example, the lateral extension of the patterned III-nitride back-barrier can be carefully chosen depending on the particular gate module used for the compound semiconductor device and according also to the shape and extension of any field plate included in the device.

Figure 1:
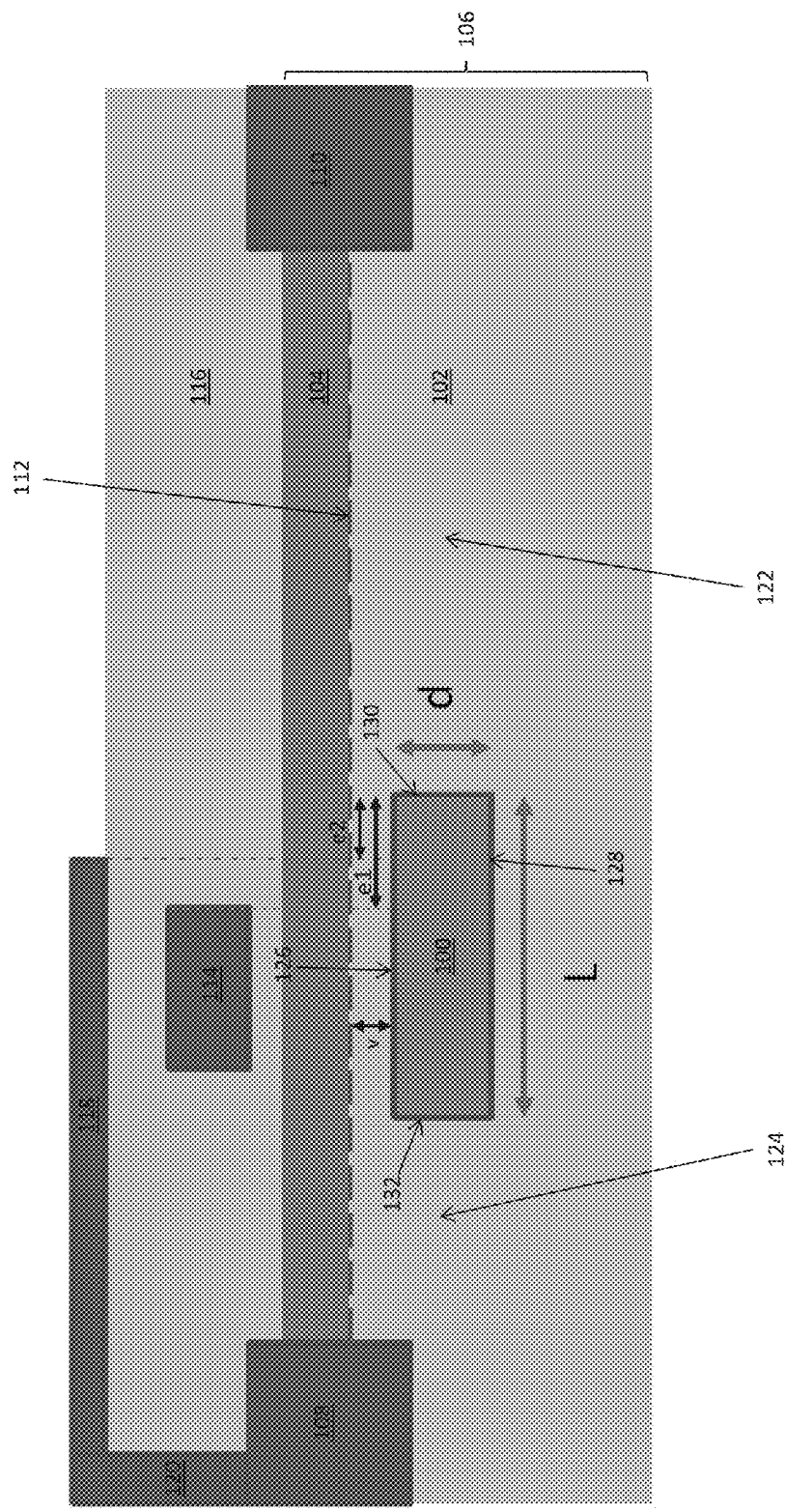
FIG. 1 illustrates a sectional view of an embodiment of a compound semiconductor device having a patterned III-nitride back-barrier.

FIG. 1 illustrates a sectional view of one embodiment of a compound semiconductor device having a patterned III-nitride back-barrier 100 buried in a III-nitride buffer 102 of the device. The III-nitride buffer 102, together with at least a III-nitride barrier 104, form a heterostructure body 106. The heterostructure body 106 also includes a source 108 and a drain 110 which are spaced apart from one another. The III-nitride barrier 104 has a different band gap than the III-nitride buffer 102 so that a two-dimensional charge carrier gas channel 112 arises along an interface between the III-nitride buffer 102 and the III-nitride barrier 104. The two-dimensional charge carrier gas channel 112 electrically connects the source 108 and the drain 110. The terms 'source' and 'drain' as used herein refer to respective doped regions of the device or to respective electrodes if no doped regions are provided. For example, typical HEMTs have source and drain ohmic contacts which are based on a metal alloy that does not require any additional doping. There is also the option to dope the source and drain region e.g. with Si to have an n+ region below the ohmic contact and to lower, therefore, the overall contact resistance of high or low voltage transistors. The lower the drain-to-source resistance ($R_{DSON}$) of the transistor, the lower the contribution coming from the contact resistance has to be. This is the case of low voltage transistors which generally present very low $R_{DSON}$.

In each case, a gate 114 is provided for controlling the two-dimensional charge carrier gas channel 112. The gate 114 can be a planar or trench gate in direct contact with the heterostructure body 106, or electrically insulated from the heterostructure body 106 by an insulating material 116 such as silicon nitride as shown in FIG. 1. The transistor can be normally-on or normally-off. For example in the case of a normally-off pGaN device, the gate 114 can be placed on top of a p-doped GaN layer (not shown) which is disposed on top of the III-nitride barrier 104. This additional pGaN layer can be patterned so that it is placed only below the gate 114. In general, the embodiments described herein can be applied to both normally-on and normally-off transistors.

The compound semiconductor device can further include a field plate 118 disposed between the source 108 and the drain 110. The field plate 118 can be made of semiconductor material or metal and is electrically insulated from the gate 114. The field plate 118 can be electrically connected to the source 108 e.g. via a contact 120 or to the gate 114, and is configured to at least partly counterbalance charged dopant atoms in the drain 110 when the transistor is in the off state i.e. the channel 112 is interrupted and a blocking voltage is applied to the drain 110. The field plate configuration shown in FIG. 1 is merely an example. Any desired field plate configuration can be used. For example, the field plate 118 can have different shapes. There can be more than one field plate 118 which can be connected either to the source 108 or gate 114.

The compound semiconductor device also includes the patterned III-nitride back-barrier 100. The patterned III-nitride back-barrier 100 is buried in the III-nitride buffer 102 and extends laterally beyond the edge of the gate 114 towards the drain 110 by a distance e1. The patterned III-nitride back-barrier 100 terminates prior to the drain 110 so that the patterned III-nitride back-barrier 100 is laterally spaced apart from the drain 100 by a region 122 of the III-nitride buffer 102. The patterned III-nitride back-barrier 100 can also laterally terminate prior to the source 108 so that the patterned III-nitride back-barrier 100 is laterally spaced apart from the source 108 by another region 124 of the III-nitride buffer 102. With such a configuration, the patterned III-nitride back-barrier 100 effectively has the form of an island region buried within the III-nitride buffer 102. The patterned III-nitride back-barrier 100 causes a reduction in the maximum electric field within the device due to hole accumulation in off-state conditions. The accumulated holes effectively act as a back field-plate which shields the high voltage applied at the drain 110 in the off-state and dramatically reduces the electric field in the gate region. The thickness (d), length (L), lateral extension (e1/e2), Al content, and vertical spacing (v) of the patterned III-nitride back-barrier 100 with respect to the channel 112 can be chosen so that the patterned III-nitride back-barrier 100 enhances the reliability of the device by reducing electric field buildup within the III-nitride barrier 104 of the device without adversely affecting device performance. The patterned III-nitride back-barrier 100 pulls up the conduction band of the III-nitride barrier 104, which results in a quantum well that confines electrons and therefore causes decreased leakage in the compound semiconductor device.

In one embodiment, the compound semiconductor device is a GaN-based HEMT. Specifically with regard to GaN technology, the presence of polarization charges and strain effects in a GaN-based heterostructure body due to spontaneous and piezoelectric polarization yield a two-dimensional charge carrier gas in the heterostructure body 106 characterized by very high carrier density and carrier mobility. This two-dimensional charge carrier gas, such as a 2DEG or 2DHG, forms the conductive channel 112 of the device near the interface between the III-nitride barrier 104, e.g., a GaN alloy barrier such as AlGaN, InAlGaN, InAlN, etc. and the III-nitride buffer 102, e.g., a GaN buffer. A thin, e.g. 1-2 nm, AlN layer can be provided between the GaN buffer 102 and the GaN alloy barrier 104 to minimize alloy scattering and enhance 2DEG mobility. In a broad sense, the compound semiconductor device described herein can be formed from any binary, ternary or quaternary III-nitride compound semiconductor material where piezoelectric effects are responsible for the device concept. The GaN buffer 102 can be manufactured on a semiconductor substrate such as a Si, SiC or sapphire substrate, on which a nucleation (seed) layer such as an AlN layer can be formed for providing thermal and lattice matching to the GaN buffer 102.

The compound semiconductor device may also have AlInN/AlN/GaN barrier/spacer/buffer layer structures. In general, the compound semiconductor device can be realized using any suitable III-nitride technology such as GaN that permits the formation of opposite polarity inversion regions due to piezoelectric effects. The gate 114 controls the conducting or non-conducting state of the two-dimensional charge carrier gas channel 112. The channel 112 of a normally-off HEMT is disrupted absent a voltage applied to the gate 114, and disrupted in the presence of a suitable gate voltage for a normally-on device. In one embodiment, the III-nitride buffer 102 comprises GaN, the III-nitride barrier 104 comprises AlGaN and the patterned III-nitride back-barrier 100 buried in the III-nitride buffer 102 comprises AlGaN. In another embodiment, the III-nitride barrier 104 comprises AlN or InAlN instead of AlGaN and the patterned III-nitride back-barrier 100 comprises the same or different Al-containing material as the III-nitride barrier 104 (e.g. AlGaN, AlN, InAlN, etc.).

In each case, the patterned III-nitride back-barrier 100 has a top side 126 facing the III-nitride barrier 104, a bottom side 128 opposite the top side 126, a first lateral edge 130 extending between the top and the bottom sides 126, 128 and facing towards the drain 110, and a second lateral edge 132 extending between the top and the bottom sides 126, 128 and facing towards the source 108. At least the top side 126, the first lateral edge 130 and the second lateral edge 132 of the patterned III-nitride back-barrier 100 are covered by the III-nitride buffer 102. In the embodiment shown in FIG. 1, the bottom side 128 of the patterned III-nitride back-barrier 100 is also covered by the III-nitride buffer 102. The patterned III-nitride back-barrier 100 extends laterally beyond the gate 114 towards the drain 110 by a distance e1. In the case of the field plate 118 being present, the field plate 118 extends laterally beyond the gate 114 towards the drain 110 and the patterned III-nitride back-barrier 100 extends laterally beyond the field plate 118 towards the drain 110 by a distance e2 as shown in FIG. 1.

Described next are various configuration embodiments for the patterned III-nitride back-barrier 100 which result in improved overall device performance and a much lower maximum electric field in the device. In one case, the Al content of the patterned III-nitride back-barrier 100 ranges between 4% and 50%, e.g., between 20% and 30%. The patterned III-nitride back-barrier 100 can extend laterally beyond the edge of the gate 114 towards the drain 110 by a distance (e1) of between 0.5 μm and 2 μm. If the field plate 118 is provided, the patterned III-nitride back-barrier 100 can extend laterally beyond the edge of the field plate 118 towards the drain 110 by a distance (e2) between 0.5 μm and 2 μm. The patterned III-nitride back-barrier 100 can have a thickness (d) of at least 0.5 μm. The patterned III-nitride back-barrier 100 can be vertically spaced apart from the two-dimensional charge carrier gas channel 112 by a distance (v) between 100 nm and 500 nm.

Each of these configuration embodiments can be implemented individually, or in conjunction with one or more of the other configuration embodiments. For example, the patterned III-nitride back-barrier 100 can have an Al content that ranges between 4% and 50%, extend laterally beyond the edge of the field plate 118 towards the drain 110 by between 0.5 μm and 2 μm, and have a thickness of at least 0.5 μm. In addition, the patterned III-nitride back-barrier 100 can also be vertically spaced apart from the two-dimensional charge carrier gas channel 112 by between 100 nm and 500 nm. Still other combinations of these configuration parameters are contemplated and within the scope of this application, and depend on the particular design requirements for the device under consideration.

FIGS. 2A through 2E illustrate an embodiment of manufacturing the compound semiconductor device shown in FIG. 1.

Figure 2A:
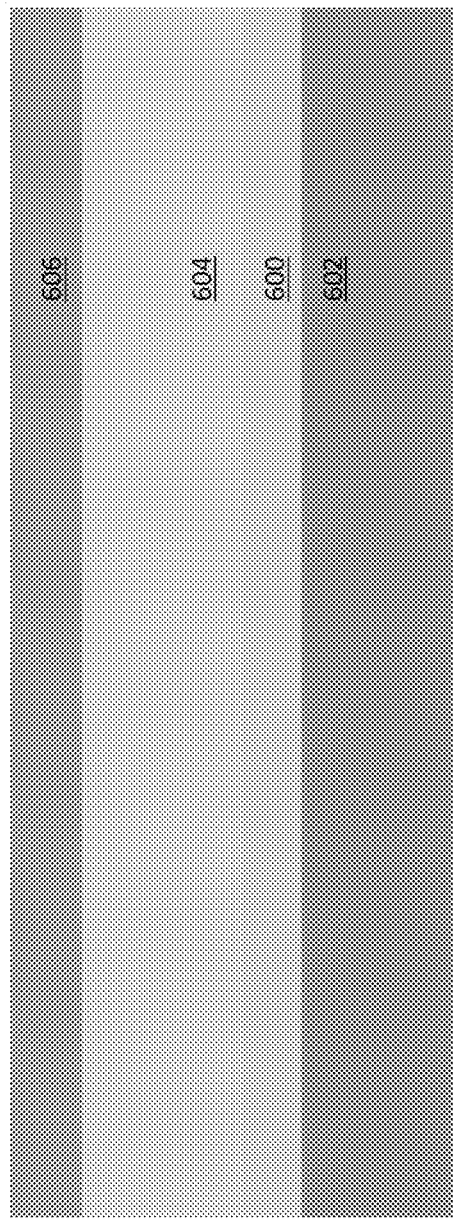

In FIG. 2A, a nucleation (seed) layer 600 such as an AlN layer is formed on a semiconductor substrate 602 such as a Si, SiC or sapphire substrate. The nucleation (seed) layer 600 provides thermal and lattice matching for a first III-nitride material 604 such as GaN formed on the substrate 602. A second III-nitride material 606 such as AlGaN, InAlGaN, InAlN, etc. is formed on the first III-nitride material 604. The second III-nitride material 606 has a different band gap than the first III-nitride material 604, and is later masked and etched to form the patterned III-nitride back-barrier 100. The first and second III-nitride materials 604, 606 can be formed by any standard epitaxial growth deposition process such as MOCVD (metalorganic vapour phase epitaxy), MBE (molecular beam epitaxy), etc. or any other suitable III-nitride material formation process. The first III-nitride material 604 forms the buffer region of the device and can be formed using any standard process such as being grown on a Silicon substrate (superlattice, graded buffer, etc.).

Figure 2B:
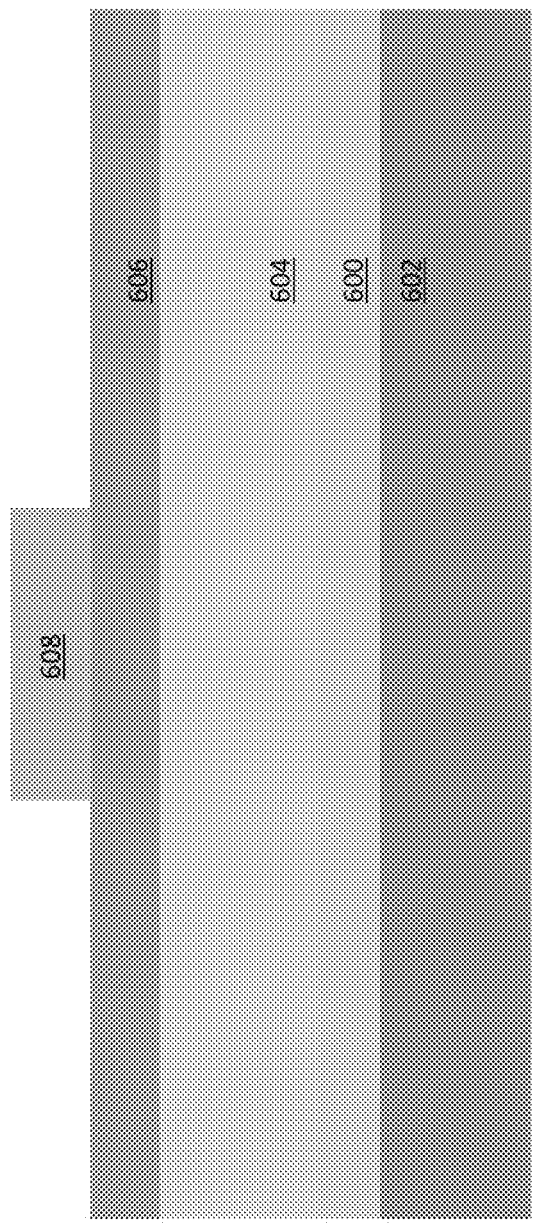

In FIG. 2B, a mask 608 such as a photoresist mask is formed on the second III-nitride material 606. The mask 608 is patterned to protect part of the second III-nitride material 606 and expose the remainder of the second III-nitride material 606.

Figure 2C:
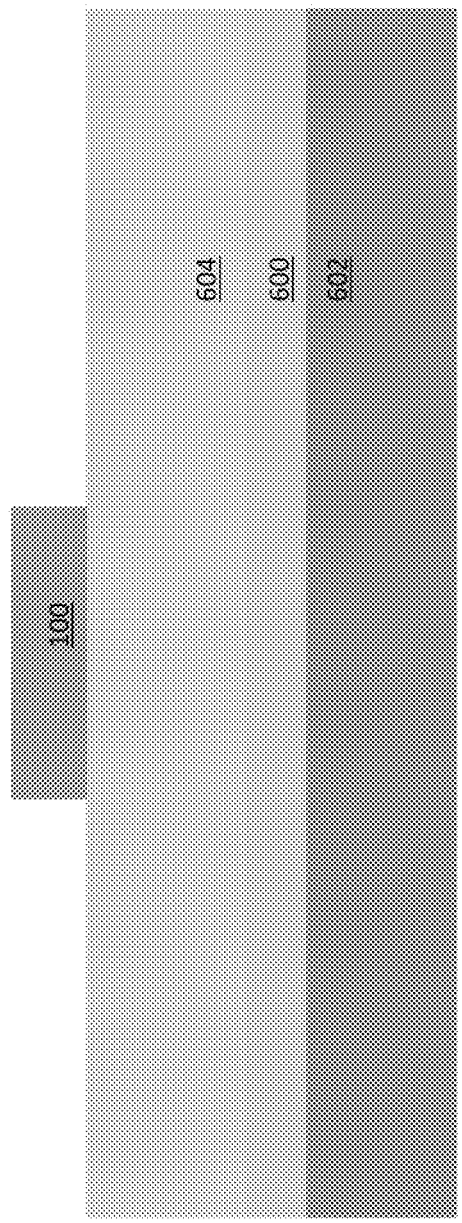

In FIG. 2C, the part of the second III-nitride material 606 unprotected by the mask 608 is removed e.g. by etching or any other standard III-nitride material removal process. Each remaining island of the second III-nitride material 606 forms a patterned III-nitride back-barrier 100. The thickness, length, lateral extension, Al content, and vertical spacing of the patterned III-nitride back-barrier 100 with respect to the channel each can be tuned individually, in different combinations, or collectively as previously described herein to yield the desired electric field and performance behavior for the device being manufactured.

Figure 2D:
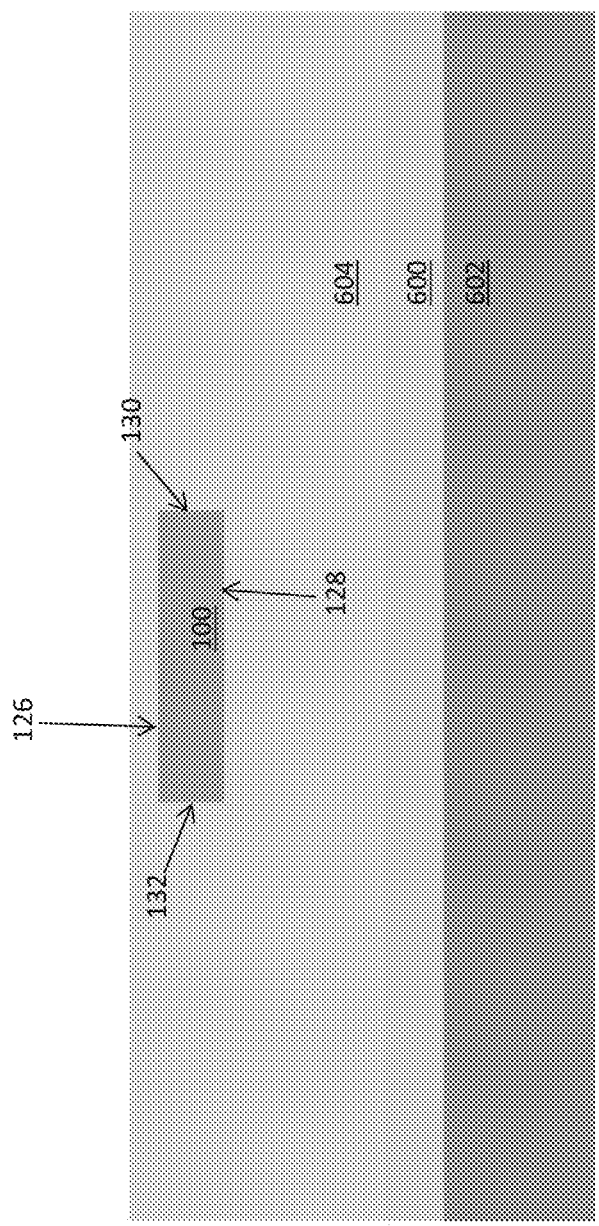

In FIG. 2D, the first III-nitride material 604 is re-grown around and onto each patterned III-nitride back-barrier 100 using MOCVD, MBE, etc., so that the first III-nitride material 604 surrounds each patterned III-nitride back-barrier 100 on all sides 126, 128, 130, 132.

In FIG. 2E, a III-nitride barrier layer 610 such as a GaN alloy barrier like AlGaN, InAlGaN, InAlN, etc. is formed on the re-grown III-nitride buffer 604. The presence of polarization charges and strain effects yield a two-dimensional charge carrier gas 612 near the interface between the re-grown III-nitride buffer 604 and the III-nitride barrier layer 610. The two-dimensional charge carrier gas 612 can be a 2DEG or 2DHG depending on the type of transistor, and provides the channel of the transistor. Standard processing is then continued to form the source, drain, gate, optional field plate, etc. as is well known in the III-nitride semiconductor arts to yield the compound semiconductor device shown in FIG. 1.

Figure 3:
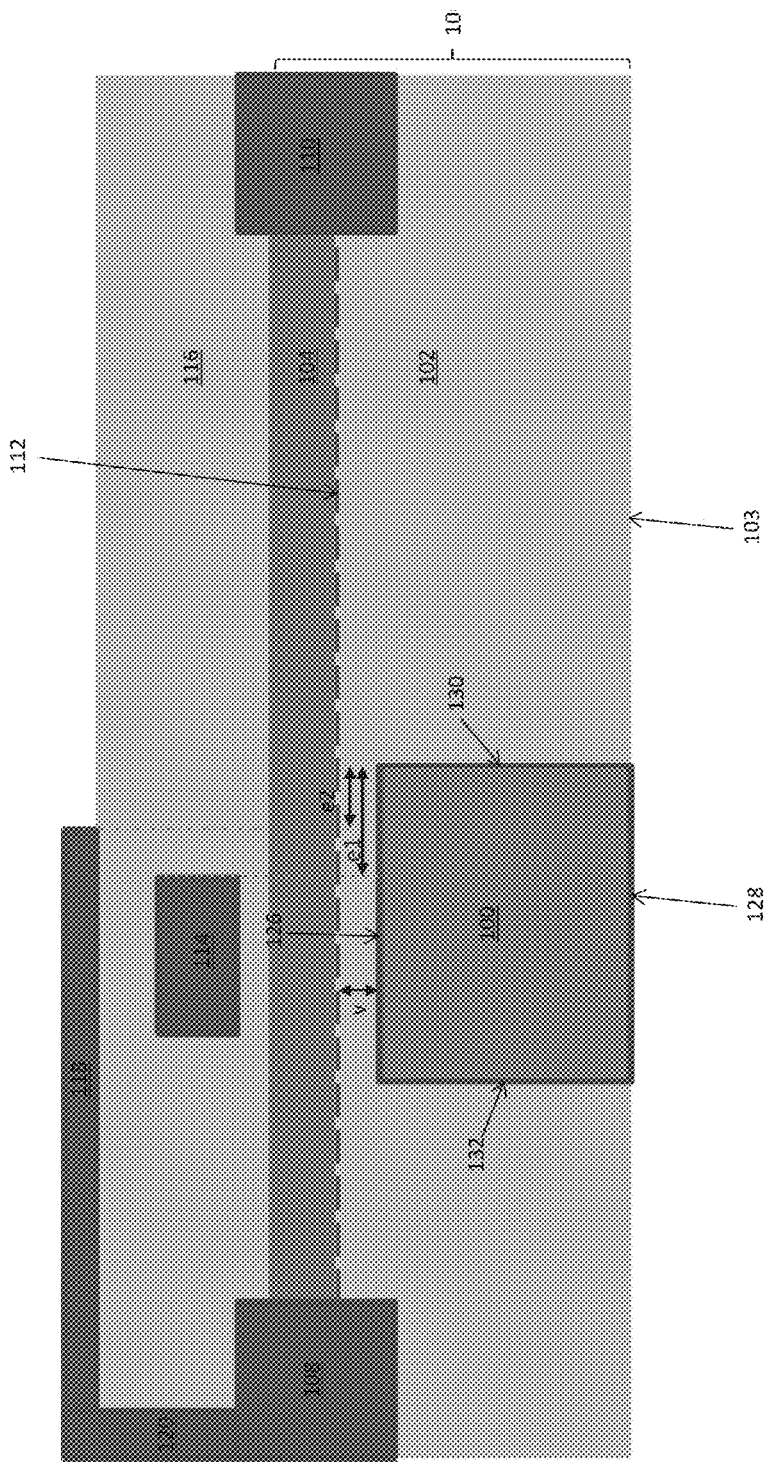
FIG. 3 illustrates a sectional view of another embodiment of a compound semiconductor device having a patterned III-nitride back-barrier.

FIG. 3 illustrates a sectional view of another embodiment of a compound semiconductor device having a patterned III-nitride back-barrier 100 buried in the III-nitride buffer 102 of the device. The embodiment shown in FIG. 3 is similar to the one shown in FIG. 1, however, the patterned III-nitride back-barrier 100 extends to a (bottom) side 103 of the III-nitride buffer 102 facing away from the III-nitride barrier 104. In one embodiment, the bottom side 128 of the patterned III-nitride back-barrier 100 is coplanar with the bottom side 103 of the III-nitride buffer 102.

Figure 4:
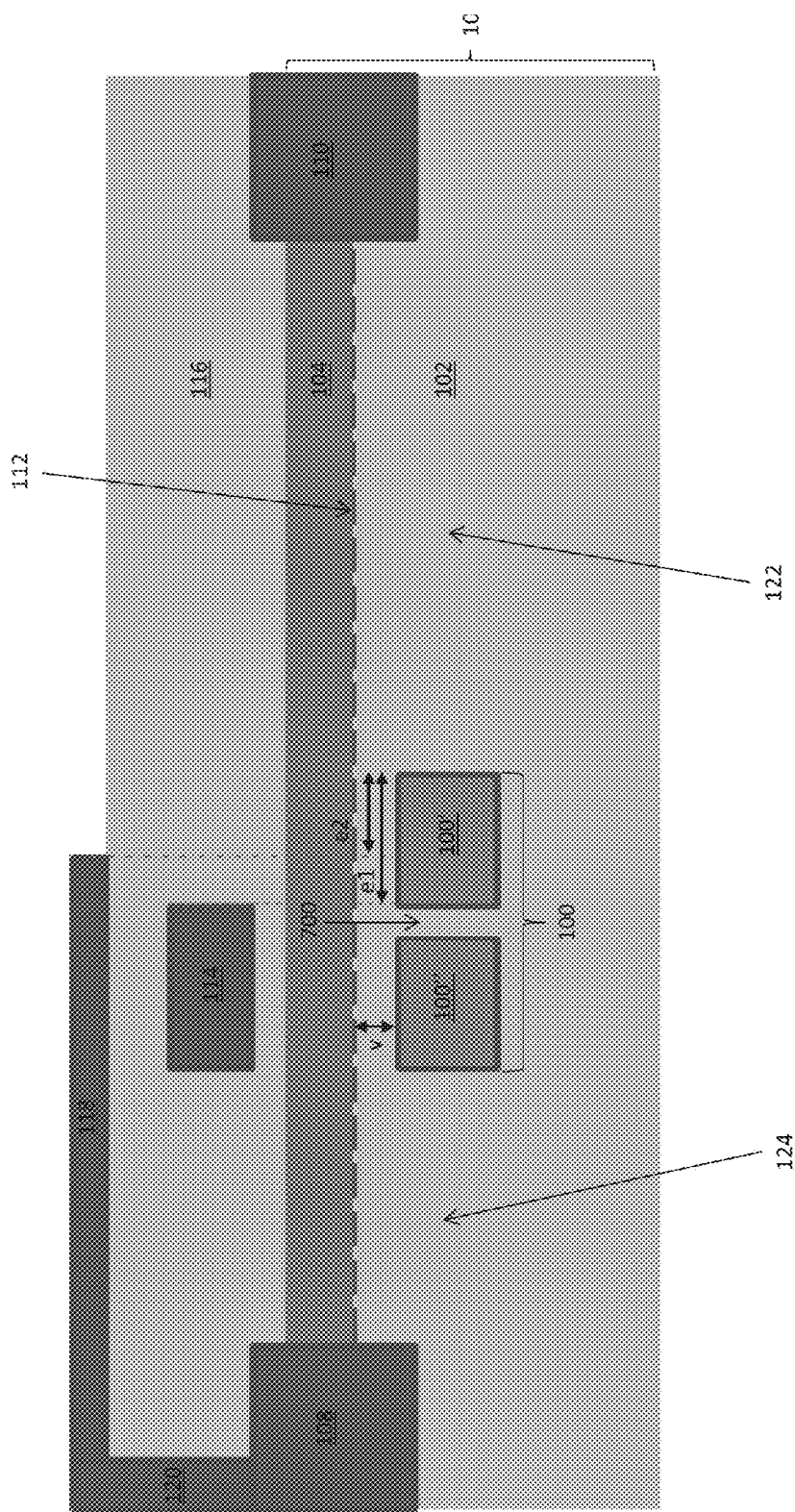
FIG. 4 illustrates a sectional view of yet another embodiment of a compound semiconductor device having a patterned III-nitride back-barrier.

FIG. 4 illustrates a sectional view of another embodiment of a compound semiconductor device having a patterned III-nitride back-barrier 100 buried in the III-nitride buffer 102 of the device. The embodiment shown in FIG. 4 is similar to the one shown in FIG. 1, however, the patterned III-nitride back-barrier 100 buried in the III-nitride buffer 102 is realized by more than one island 100', 100". Two (or more) III-nitride back-barrier islands 100', 100" are shown buried in the III-nitride buffer 102 in FIG. 4. In general, the III-nitride back-barrier 100 can be implemented as any desired number of separate islands laterally spaced apart from one another in the III-nitride buffer 102 between the source 108 and the drain 110. Adjacent ones of the patterned III-nitride back-barrier islands 100', 100" are spaced apart from one another by a region 700 of the III-nitride buffer 102. The patterned III-nitride back-barrier island 100' spaced closest to the drain 110 terminates prior to the drain 110 so that this III-nitride back-barrier island 100' is laterally spaced apart from the drain 110 by a region 122 of the III-nitride buffer 102. The patterned III-nitride back-barrier island 100" spaced closest to the source 108 similarly terminates prior to the source 108 so that this III-nitride back-barrier island 100" is laterally spaced apart from the source 108 by another region 124 of the III-nitride buffer 102.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A compound semiconductor device, comprising:
    a III-nitride buffer;
    a III-nitride barrier on the III-nitride buffer, the III-nitride barrier having a different band gap than the III-nitride buffer so that a two-dimensional charge carrier gas channel arises along an interface between the III-nitride buffer and the III-nitride barrier;
    a source and a drain spaced apart from one another and electrically connected to the two-dimensional charge carrier gas channel;
    a gate for controlling the two-dimensional charge carrier gas channel between the source and the drain;
    a patterned III-nitride back-barrier buried in the III-nitride buffer, the patterned III-nitride back-barrier extending laterally beyond the gate towards the drain and terminating prior to the drain so that the patterned III-nitride back-barrier is laterally spaced apart from the drain by a region of the III-nitride buffer; and
    a field plate disposed above and electrically insulated from the gate, the field plate being electrically connected to the source or the gate and extending laterally beyond the gate towards the drain,
    wherein the patterned III-nitride back-barrier extends laterally beyond the field plate towards the drain.

2. The compound semiconductor device of claim 1, wherein the III-nitride buffer comprises GaN, the III-nitride barrier comprises AlGaN and the patterned III-nitride back-barrier comprises AlGaN.

3. The compound semiconductor device of claim 1, wherein the patterned III-nitride back-barrier comprises Al.

4. The compound semiconductor device of claim 3, wherein the Al content of the patterned III-nitride back-barrier ranges between 4% and 50%.

5. The compound semiconductor device of claim 4, wherein the Al content of the patterned III-nitride back-barrier ranges between 20% and 30%.

6. The compound semiconductor device of claim 1, wherein the patterned III-nitride back-barrier extends to a side of the III-nitride buffer facing away from the III-nitride barrier.

7. The compound semiconductor device of claim 1, wherein the patterned III-nitride back-barrier extends laterally beyond the gate towards the drain by between 0.5 μm and 2 μm.

8. The compound semiconductor device of claim 1, wherein the patterned III-nitride back-barrier is at least 0.5 μm thick.

9. The compound semiconductor device of claim 1, wherein the patterned III-nitride back-barrier is spaced apart from the two-dimensional charge carrier gas channel by between 100 nm and 500 nm.

10. The compound semiconductor device of claim 1, wherein the patterned III-nitride back-barrier extends laterally beyond the field plate towards the drain by between 0.5 μm and 2 μm.

11. The compound semiconductor device of claim 1, wherein the patterned III-nitride back-barrier comprises Al, wherein the Al content of the patterned III-nitride back-barrier ranges between 4% and 50%, wherein the patterned III-nitride back-barrier extends laterally beyond the field plate towards the drain by between 0.5 μm and 2 μm, and wherein the patterned III-nitride back-barrier is at least 0.5 μm thick.

12. The compound semiconductor device of claim 11, wherein the patterned III-nitride back-barrier is spaced apart from the two-dimensional charge carrier gas channel by between 100 nm and 500 nm.

13. The compound semiconductor device of claim 1, wherein the patterned III-nitride back-barrier is configured to reduce an electric field that builds-up within the III-nitride barrier by at least 1 MV/cm.

14. The compound semiconductor device of claim 1, wherein the patterned III-nitride back-barrier laterally terminates prior to the source so that the patterned III-nitride back-barrier is laterally spaced apart from the source by a region of the III-nitride buffer.

15. The compound semiconductor device of claim 1, further comprising an additional patterned III-nitride back-barrier buried in the III-nitride buffer between the patterned III-nitride back-barrier and the source, wherein the additional patterned III-nitride back-barrier is spaced apart from the patterned III-nitride back-barrier by a first region of the III-nitride buffer and terminates prior to the source so that the additional patterned III-nitride back-barrier is laterally spaced apart from the source by a second region of the III-nitride buffer.

16. A compound semiconductor device, comprising:
    a III-nitride buffer;
    a III-nitride barrier on the III-nitride buffer, the III-nitride barrier having a different band gap than the III-nitride buffer so that a two-dimensional charge carrier gas channel arises along an interface between the III-nitride buffer and the III-nitride barrier;
    a source and a drain spaced apart from one another and electrically connected by the two-dimensional charge carrier gas channel;

a gate for controlling the two-dimensional charge carrier gas channel; and a patterned III-nitride back-barrier buried in the III-nitride buffer, the patterned III-nitride back-barrier having a top side facing the III-nitride barrier, a bottom side opposite the top side, a first lateral edge extending between the top and the bottom side and facing towards the drain, and a second lateral edge extending between the top and the bottom side and facing towards the source, wherein at least the top side, the first lateral edge and the second lateral edge of the patterned III-nitride back-barrier are covered by the III-nitride buffer, wherein the patterned III-nitride back-barrier extends laterally beyond the gate towards the drain and terminates prior to the drain so that the patterned III-nitride back-barrier is laterally spaced apart from the drain by a first region of the III-nitride buffer, wherein the patterned III-nitride back-barrier terminates prior to the source so that the patterned III-nitride back-barrier is laterally spaced apart from the source by a second region of the III-nitride buffer, wherein the patterned III-nitride back-barrier comprises a different III-nitride material than the III-nitride buffer and has a higher aluminum content than the III-nitride buffer.

17. A method of manufacturing a compound semiconductor device, the method comprising:

forming a III-nitride buffer on a substrate;

forming a patterned III-nitride back-barrier buried in the III-nitride buffer;

forming a III-nitride barrier on the III-nitride buffer, the III-nitride barrier having a different band gap than the III-nitride buffer so that a two-dimensional charge carrier gas channel arises along an interface between the III-nitride buffer and the III-nitride barrier;

forming a source and a drain spaced apart from one another and electrically connected to the two-dimensional charge carrier gas channel;

forming a gate for controlling the two-dimensional charge carrier gas channel between the source and the drain; and forming a field plate above and electrically insulated from the gate, the field plate being electrically connected to the source or the gate and extending laterally beyond the gate towards the drain, wherein the patterned III-nitride back-barrier extends laterally beyond the gate towards the drain and terminates prior to the drain so that the patterned III-nitride back-barrier is laterally spaced apart from the drain by a region of the III-nitride buffer, wherein the patterned III-nitride back-barrier extends laterally beyond the field plate towards the drain.

18. The method of claim 17, wherein forming the III-nitride buffer on the substrate and forming the patterned III-nitride back-barrier buried in the III-nitride buffer comprises:

growing a first III-nitride material on the substrate;

growing a second III-nitride material on the substrate, the second III-nitride material having a different band gap than the first III-nitride material;

removing the second III-nitride material from part of the first III-nitride material to form the patterned III-nitride back-barrier; and re-growing the first III-nitride material around and onto the patterned III-nitride back-barrier so that the first III-nitride material surrounds the patterned III-nitride back-barrier.

* * * * *